(12) United States Patent
Suhara et al.

(10) Patent No.: US 6,649,926 B2
(45) Date of Patent: Nov. 18, 2003

(54) SUCTION NOZZLE, AND ELECTRIC-COMPONENT-POSITION DETECTING APPARATUS

(75) Inventors: Shinsuke Suhara, Kariya (JP); Yukio Ueno, Nagoya (JP); Takeyoshi Isogai, Hekinan (JP); Noriaki Iwaki, Hekinan (JP)

(73) Assignee: Fuji Machine Mfg. Co., Ltd., Aichi-ken (JP)

( * ) Notice: Subject to any disclaimer, the term of this patent is extended or adjusted under 35 U.S.C. 154(b) by 26 days.

(21) Appl. No.: 09/935,745

(22) Filed: Aug. 24, 2001

(65) Prior Publication Data

US 2002/0027207 A1 Mar. 7, 2002

(30) Foreign Application Priority Data

Sep. 5, 2000 (JP) ........................................ 2000-268773

(51) Int. Cl.$^7$ .............................................. G01N 21/86
(52) U.S. Cl. ............................ 250/559.29; 250/559.4; 414/752.1
(58) Field of Search ........................ 250/559.4, 559.29; 901/40, 46, 47; 414/627, 752.1, 939, 941, 793

(56) References Cited

U.S. PATENT DOCUMENTS

| | | | |
|---|---|---|---|
| 4,793,707 A | | 12/1988 | Hata et al. .................... 356/375 |
| 5,012,115 A | * | 4/1991 | Asai et al. .............. 250/559.17 |
| 5,131,139 A | * | 7/1992 | Oyama et al. ................. 29/721 |
| 5,224,262 A | | 7/1993 | Takaichi et al. ............... 29/721 |
| 5,471,310 A | * | 11/1995 | Spigarelli et al. ............ 356/399 |
| 6,292,261 B1 | * | 9/2001 | Fishbaine et al. ........... 356/614 |

FOREIGN PATENT DOCUMENTS

| | | |
|---|---|---|
| EP | 0 727 934 A1 | 8/1996 |
| JP | A 62-46382 | 2/1987 |
| JP | A 11-214897 | 8/1999 |
| JP | A 11-220294 | 8/1999 |

\* cited by examiner

Primary Examiner—Stephone B Allen
(74) Attorney, Agent, or Firm—Oliff & Berridge, PLC

(57) ABSTRACT

A suction nozzle for applying a suction to an object and thereby holding the object, the suction nozzle including a nozzle portion having an end surface, and a suction passage formed in the nozzle portion and opening in the end surface thereof, the end surface providing a suction surface that applies the suction to the object and thereby holds the object. At least a free end portion of the nozzle portion has a shape whose diameter gradually increases in a direction from the end surface thereof toward a base end thereof opposite to the end surface.

12 Claims, 9 Drawing Sheets

FIG. 9
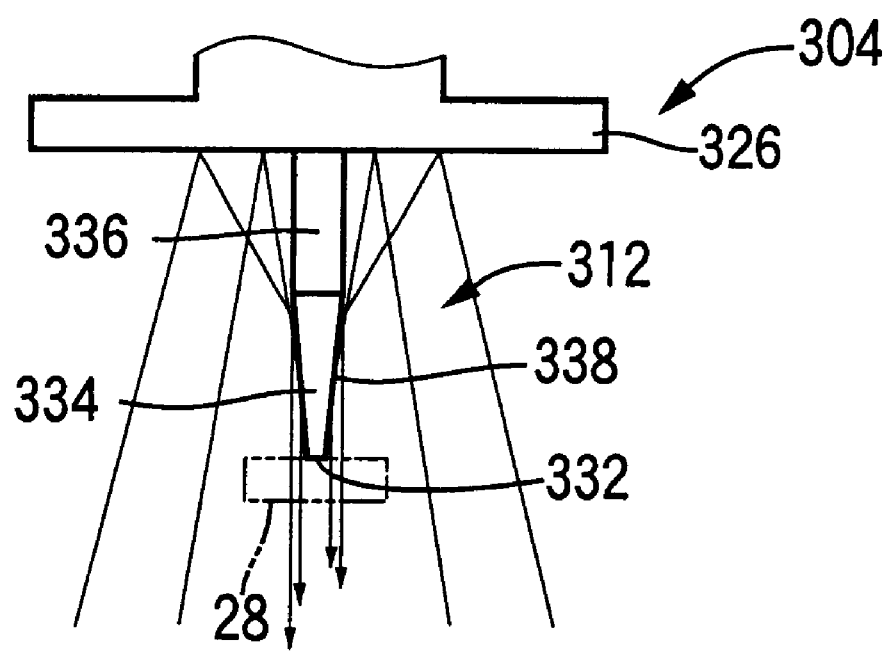
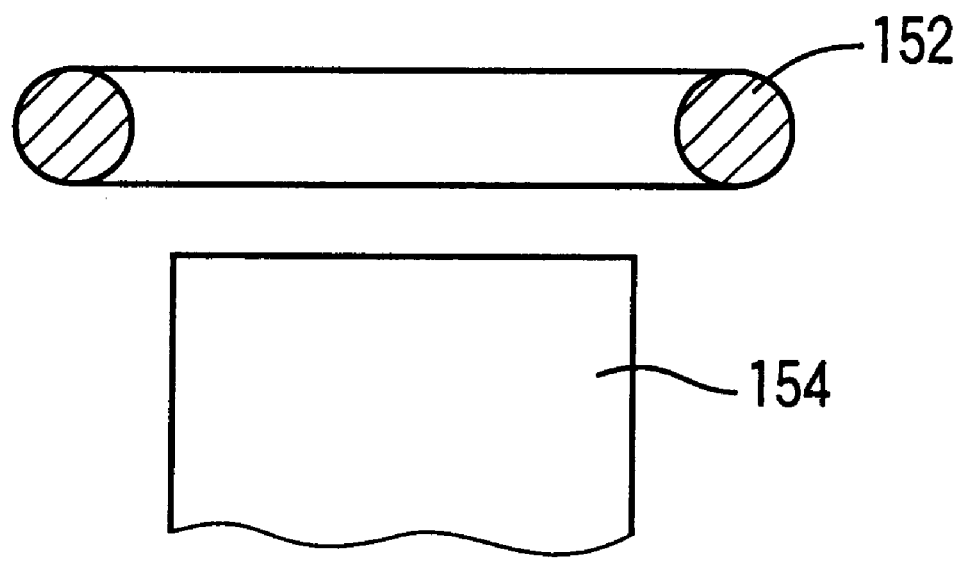

SUCTION NOZZLE, AND ELECTRIC-COMPONENT-POSITION DETECTING APPARATUS

BACKGROUND OF THE INVENTION

1. Field of the Invention

The present invention relates to a suction nozzle and particularly to the art of improving the durability of a suction nozzle.

2. Discussion of Related Art

A suction nozzle is used to suck and hold an object, such as an electric component (EC), so as to mount the EC on a printed wiring board (PWB) as a sort of circuit substrate. The suction nozzle includes a nozzle portion having an end surface which functions as a suction surface, and a suction passage which opens in the suction surface. An image of the EC held by the suction nozzle may be taken so that image data representing the taken image are processed to determine a position of the EC held by the nozzle. In the case where a silhouette image of the EC is taken, the suction nozzle may additionally include a light-radiating portion which radially outwardly projects from a base portion thereof and has a light-radiating surface from which a light, such as a visible light or an ultraviolet light, is emitted. If a shadow of the suction nozzle overflows that of the EC, then it will be difficult to process the taken silhouette image, which will lead to lowering an accuracy with which a position of the EC held by the nozzle is determined. To avoid this problem, it has been a general practice to use a suction nozzle whose size is smaller than that of an EC. However, in a special case where an EC is very small, a user cannot help using a suction nozzle whose size is greater than that of the EC. In this case, if the suction passage of the nozzle portion may not be completely closed by the EC, the EC may not be completely held by the suction nozzle, so that the suction nozzle may fail to hold the EC, or the EC may fall off the suction nozzle. This is true with a case where a position of an EC held by a suction nozzle is determined based on a reflection-light image of the EC and a case where no image is taken to determine a position of an EC held by a suction nozzle.

Thus, a small EC is necessarily held by a suction nozzle including a nozzle portion whose diameter is small. However, when the suction nozzle holds an EC or mounts the EC, the nozzle portion receives some load. Conventionally, this load causes bending of the nozzle portion, thereby reducing the life expectancy of the suction nozzle. This leads to increasing the frequency of exchanging of suction nozzles, thereby increasing the running cost of the mounting apparatus. In addition, since the operation efficiency of the mounting apparatus lowers because of the frequent exchanging of suction nozzles, the production efficiency thereof also lowers. Moreover, if a suction nozzle including a small-diameter nozzle portion is used, the nozzle portion easily vibrates, which may lead to lowering an accuracy with which an EC held by the suction nozzle is mounted on a PWB.

SUMMARY OF THE INVENTION

The present invention provides a suction nozzle and an EC-position detecting apparatus that have each feature described below. An EC may be, in particular, an electronic component. The following features are described, like claims, in respective paragraphs that are given respective sequential numbers. Any feature that includes another feature shall do so by referring to the number given to the latter feature. However, the following features and the appropriate combinations thereof are just examples to which the technical features, and the combinations thereof, described in the specification are by no means limited. In addition, in the case where one feature recites a plurality of items, it is not essentially required that all of those items be simultaneously employed in the one feature. That is, it is possible to select and employ only a portion (one, two, . . . , but not all) of those items.

(1) According to a first feature of the present invention, there is provided a suction nozzle for applying a suction to an object and thereby holding the object, the suction nozzle including a nozzle portion having an end surface, and a suction passage formed in the nozzle portion and opening in the end surface thereof, the end surface providing a suction surface that applies the suction to the object and thereby holds the object, wherein the improvement comprises at least a free end portion of the nozzle portion having a shape whose diameter gradually increases in a direction from the end surface thereof toward a base end thereof opposite to the end surface.

Since at least the free end portion of the nozzle portion has the shape whose diameter gradually increases in the direction from the end surface toward the base end, the free end portion may be so thin that the contour of the end surface may not overflow that of the object, or an amount of overflow of the former contour may be little, whereas the base end of the nozzle portion may be thicker than the free end portion thereof. Therefore, the nozzle portion can enjoy an increased flexural strength and an improved durability. In addition, the nozzle portion can enjoy a high flexural rigidity, in spite of having the thin free end portion, so that the nozzle portion may not be easily vibrated. Thus, the suction nozzle can enjoy an improved accuracy with which the nozzle mounts the object, such as an electric component (EC), on a circuit substrate such as a printed wiring board (PWB). In order to improve the flexural strength and rigidity of the nozzle portion, it is desirable that the nozzle portion have a shape whose diameter gradually increases from the end surface to the base end, i.e., as a whole, as recited in the second feature (2).

(2) According to a second feature of the present invention that includes the first feature (1), the nozzle portion has a shape whose diameter gradually increases from the end surface to the base end.

(3) According to a third feature of the present invention that includes the first or second feature (1) or (2), the nozzle portion has a tapered shape whose diameter linearly increases in the direction from the end surface to the base end.

There are some cases where it is desirable that the nozzle portion have a shape whose diameter nonlinearly changes depending upon a shape, a size, a position, etc. of a light emitter. However, in many cases, the nozzle portion whose diameter linearly changes can achieve its aim. In addition, the suction nozzle having the latter nozzle can be easily produced.

(4) According to a fourth feature of the present invention that includes any one of the first to third features (1) to (3), the suction nozzle further includes a light radiating portion extending radially outwardly from a base end portion of the nozzle portion, and having a light radiating surface which radiates a light.

(5) According to a fifth feature of the present invention that includes the fourth feature (4), at least a radially outer portion of the light radiating surface is so inclined that a distance of the radially outer portion from the end surface of the nozzle portion in a direction parallel to an axis line thereof gradually increases in a radially inward direction.

Since at least the radially outer portion of the light radiating surface is so inclined that the distance of the radially outer portion from the end surface of the nozzle portion in the direction parallel to the axis line thereof gradually increases radially inward direction, the light radiated from the light radiating surface can easily gather toward the central axis line of the suction nozzle. Thus, the object can have a uniform, light background, and accordingly an excellent silhouette image of the object can be taken. In particular, in the case where an outer circumferential surface of the nozzle portion provides a reflection surface, as recited in the eighth feature (8), the light radiated from the light radiating surface can easily gather toward the reflection surface.

(6) According to a sixth feature of the present invention that includes the fourth or fifth feature (4) or (5), an entirety of the light radiating surface is so inclined that the distance of the light radiating surface from the end surface of the nozzle portion gradually increases in the radially inward direction.

(7) According to a seventh feature of the present invention that includes any one of the fourth to sixth features (4) to (6), the light radiating surface has a tapered shape whose diameter linearly decreases as a distance of the light radiating surface from the end surface of the nozzle portion in the direction parallel to the axis line thereof increases.

There are some cases where it is desirable that the light radiating surface have a shape whose diameter nonlinearly changes depending upon a shape, a size, a position, etc. of the nozzle portion or a light emitter. However, in many cases, the light radiating surface whose diameter linearly changes can achieve its aim. In addition, the suction nozzle having the latter light radiating surface can be easily produced.

(8) According to an eighth feature of the present invention that includes any one of the first to seventh features (1) to (7), an outer circumferential surface of at least the free end portion of the nozzle portion that has the shape whose diameter gradually increases provides a reflection surface which reflects the light radiated by the light radiating surface.

Since the outer circumferential surface of at least the free end portion of the nozzle portion that has the shape whose diameter gradually increases provides a reflection surface, the light radiated from the light radiating surface is reflected by the reflection surface toward the object held by the suction surface. Thus, the object held by the suction surface can have a uniform background.

(9) According to a ninth feature of the present invention that includes any one of the fourth to eighth features (4) to (8), the light radiating surface comprises a fluorescent surface which absorbs an ultraviolet light emitted by a light emitter in the direction from the end surface of the nozzle portion toward the base end thereof, and radiates a visible light.

If this suction nozzle is used with an image taking device including at least one of a filter which cuts off an ultraviolet light and allows passing of a visible light, and an image-taking element which is not sensitive to an ultraviolet light and is sensitive to a visible light, the silhouette image of the object can be prevented from being lighted by the ultraviolet light reflected by the object and accordingly the accuracy of detection of the contour of the object can be effectively prevented from being lowered.

(10) According to a tenth feature of the present invention that includes any one of the fourth to eighth features (4) to (8), the light radiating surface comprises a reflection surface which reflects a light emitted by a light emitter in the direction from the end surface of the nozzle portion toward the base end thereof.

In this case, it is desirable to employ a shield member which prevents the object from being exposed to the light such as a visible light or an ultraviolet light.

(11) According to an eleventh feature of the present invention that includes any one of the fourth to eighth features (4) to (8), the light radiating portion comprises a light emitting portion which incorporates a light source, and the light radiating surface radiates a light emitted by the light source.

(12) According to a twelfth feature of the present invention, there is provided an apparatus for detecting a position of an electric component, comprising a suction nozzle according to any one of the first to eleventh features (1) to (11), the suction nozzle holding the electric component; an annular light source which is provided at a position where the annular light source is caused, at at least one timing, to be concentric with the suction nozzle, and which radiates a light along the nozzle portion; an image taking device which takes an image of the electric component held by the nozzle portion, and a background of the electric component, at the at least one timing; and an image processing device which processes image data representing the image taken by the image taking device and thereby determines the position of the electric component held by the nozzle portion.

(13) According to a thirteenth feature of the present invention that includes the twelfth feature (12), respective dimensions and positions of the nozzle portion, the light radiating surface, and the light source are so determined that a difference between a greatest brightness, and a smallest brightness, of the background of the electric component in the image taken by the image taking device is not greater than 25% of the greatest brightness.

The greatest brightness and smallest brightness of the background may be selected from respective brightness values of respective picture elements or pixels of the background, or respective average brightness values of respective unit areas of the background. Each unit area may be four picture elements (2×2), nine picture elements (3×3), or thirteen picture elements (1, 3, 5, 3, and 1 elements arranged along one axis). The respective picture elements or pixels of the background may correspond to respective image-taking elements (e.g., CCDs) of the image taking device.

If the difference between the greatest and smallest brightness values of the background is great, it is difficult to accurately detect the boundary between the image of the electric component (EC) and the image of the background, i.e., the contour of the EC. Though the unevenness of brightness of the background image can be dealt with to some extent by image-processing techniques, it is desirable that respective dimensions and positions of the nozzle portion, the light radiating surface, and the light source be so determined that the difference between the greatest and smallest brightness values of the background image is not greater than 25% of the greatest brightness, more preferably not greater than 20%, and most preferably not greater than 15%.

BRIEF DESCRIPTION OF THE DRAWINGS

The above and other objects, features, advantages and technical and industrial significance of the present invention will be better understood by reading the following detailed description of preferred embodiments of the invention, when considered in connection with the accompanying drawings, in which:

FIG. 9 is a front elevation view for explaining a manner in which the EC-position detecting apparatus of FIG. 8 detects a position of an EC held by the suction nozzle.

DETAILED DESCRIPTION OF PREFERRED EMBODIMENTS

Hereinafter, there will be described in detail an electric-component (EC) mounting system including suction nozzles and EC-position detecting apparatuses to which the present invention is applied, by reference to the drawings.

Figure 1:
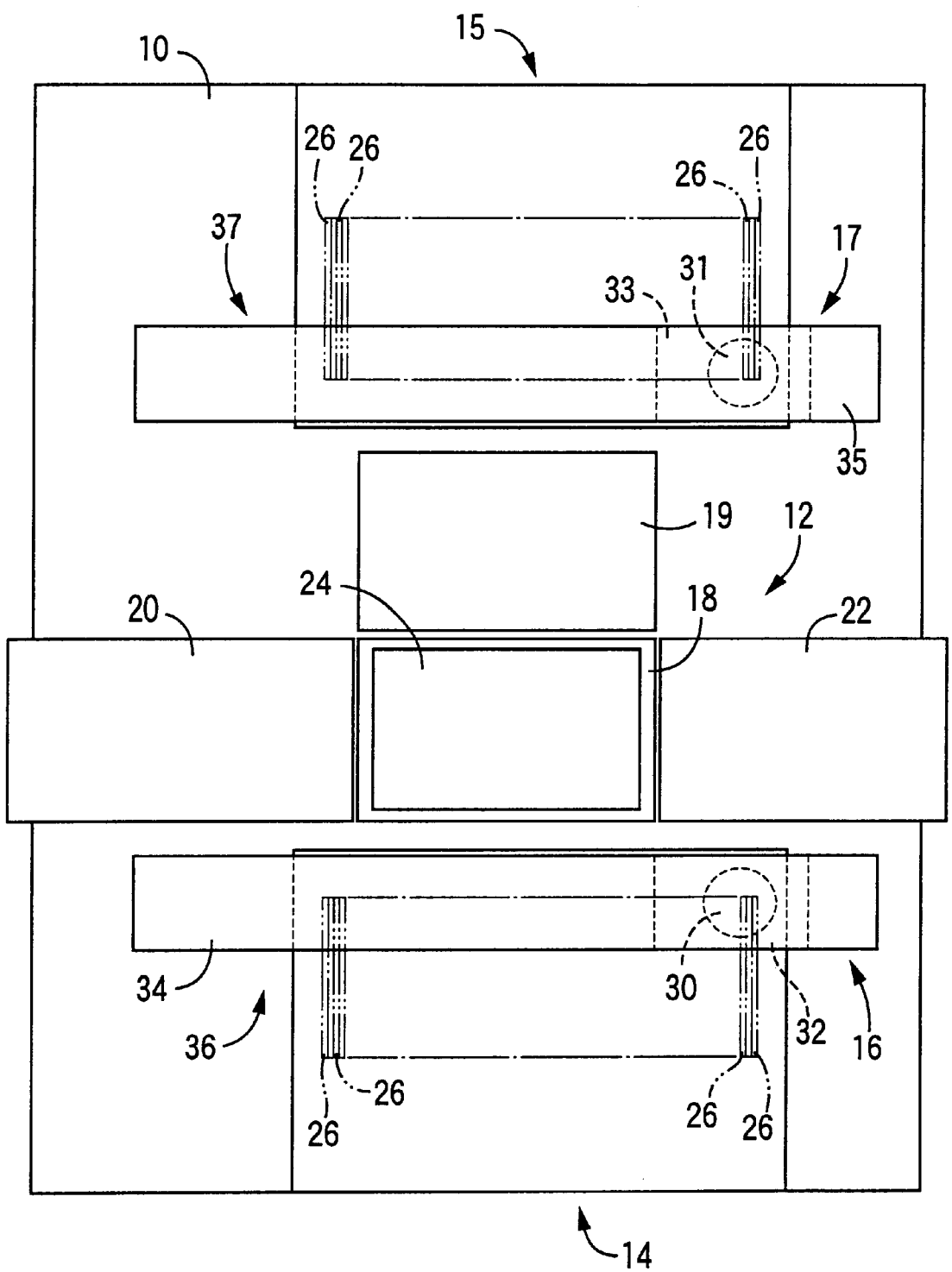
FIG. 1 is a plan view of an electric-component (EC) mounting system comprising an EC transferring and mounting apparatus including a suction nozzle embodying the present invention, and an EC-position detecting apparatus embodying the present invention.

As shown in FIG. 1, the present EC mounting system includes a base 10 on which a printed-wiring-board (PWB) conveyor 12, two EC supplying devices 14, 15, and two EC transferring and mounting apparatuses 16, 17 are provided. Since the PWB conveyor 12 is not relevant to the present invention, the PWB conveyor 12 is briefly described below. The PWB conveyor 12 includes two main conveyors 18, 19, a single shiftable carry-in conveyor 20, and a single shiftable carry-out conveyor 22. The two main conveyors 18, 19 include respective PWB positioning and supporting devices each of which positions and supports a PWB 24 as a circuit substrate, and are juxtaposed, that is, arranged side by side, in a direction (i.e., a Y-axis direction) which is perpendicular, on a horizontal plane, to a direction (i.e., an X-axis direction or a left-right direction in FIG. 1) in which the PWB 24 is conveyed. The X-axis direction will be referred as the PWB-convey direction, if appropriate. The carry-in conveyor 20 carries in a PWB 24 to each of the main conveyors 18, 19, and the carry-out conveyor 22 receives, from each of the main conveyors 18, 19, a PWB 24 on which ECs have been mounted, i.e., a printed circuit board as an electric circuit.

Each of the EC supplying devices 14, 15 includes a plurality of EC feeders 26 (hereinafter, referred to as the feeders 26) which are detachably attached to a feeder-support table such that respective EC-supply portions of the feeders 26 are arranged along a straight line parallel to the X-axis direction. Each feeder 26 may be one which feeds an EC tape carrying a plurality of ECs at a regular interval of distance and thereby supplies the ECs to the EC-supply portion thereof, or one which includes a casing accommodating ECs, arranges the ECs into an array owing to vibration, inclination, air flow, a conveyor belt, or any combination thereof, and supplies the ECs, one by one, to the each feeder 26. The respective EC-supply portions of the feeders 26 can be said as respective EC-take-out portions of the feeders 26 from which the EC transferring and mounting apparatuses 16, 17 take out respective ECs.

The EC transferring and mounting apparatuses 16, 17 transfer respective ECs 28 each as an object taken out of the respective EC supplying devices 14, 15, and mount the respective ECs 28 on the PWB 24 positioned and supported by the main conveyor 18 or 19. The BC transferring and mounting apparatuses 16, 17 include respective mounting heads 30, 31, respective X-Y robots 36, 37 which include respective X-axis slides 32, 33 and respective Y-axis slides 34, 35 and which move the respective mounting heads 30, 31 to respective arbitrary positions on a horizontal plane. Since the two mounting heads 30, 31 have the same construction and the two X-Y robots 36, 37 have the same construction, only the mounting head 30 and the X-Y robot 36 will be described below. The Y-axis slide 34 is provided on the base 10 such that the Y-axis slide 34 is movable in the Y-axis direction, and the X-axis slide 32 is provided on the Y-axis slide 34 such that the X-axis slide 32 is movable in the X-axis direction. The Y-axis slide 34 is moved in the Y-axis direction by a Y-axis-slide moving device including a servomotor 38 (FIG. 4) as a drive source and a motion-converting device which converts the rotation of the servomotor 38 into linear motion and transmits the linear motion to the Y-axis slide 34. Similarly, the X-axis slide 32 is moved in the X-axis direction by an X-axis-slide moving device including a servomotor 42 (FIG. 4) as a drive source and a motion converting device which converts the rotation of the servomotor 42 into linear motion and transmits the linear motion to the X-axis slide 32.

Figure 2:
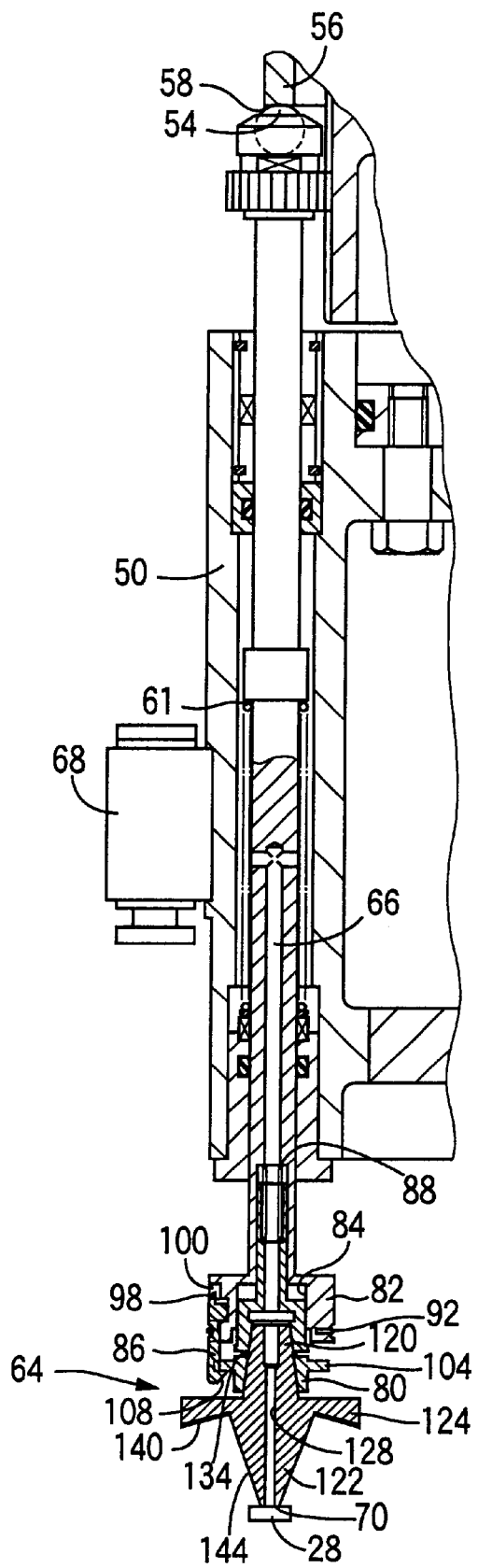
FIG. 2 is a cross-sectioned, front elevation view of a relevant portion of the EC transferring and mounting apparatus.

As shown in FIG. 2, the mounting head 30 includes a rotatable body 50 which is attached to the X-axis slide 32 such that the rotatable body 30 is intermittently rotatable about a vertical axis line. The rotatable body 50 is rotated by an arbitrary angle in each of opposite directions by a rotating device including a servomotor 52 (FIG. 4) as a drive source. Each of the above-described servomotors 38, 42, 52 is a rotary motor as a sort of electric motor and is accurately controllable with respect to its rotation angle and its rotation speed. The servomotors 65, 66, 70 may be replaced with stepper motors.

The rotatable body 50 supports a plurality of holding shafts 60 (FIG. 3), such that the plurality of holding shafts 60 are equiangularly spaced from one another about an axis line about which the rotatable body 50 is rotated. Each of the holding shafts 60 holds, at a lower end portion thereof, a suction nozzle 64 which sucks and holds an EC 28. The holding shafts 60 are fitted in respective holes formed through the rotatable body 50 such that the holding shafts 60 are movable in respective axial directions parallel to the axis line of rotation of the body 50 and are rotatable about their own axis lines. When the rotatable body 50 is rotated, the holding shafts 60 are revolved about the axis line of rotation of the body 50. As the rotatable body 50 is intermittently rotated at an angular pitch equal to that at which the holding shafts 60 are provided around the axis line of the body 50, each of the holding shafts 60 is sequentially stopped at each of a plurality of stop positions including an EC-hold-and-mount position and an image-take position. At the EC-hold-and-mount position, each suction nozzle 64 takes an EC 28 from the EC supplying device 14, and mounts the EC 28 on a PWB 24. A spherical cam follower 54 is rotatably attached to an upper end of each of the holding shafts 60. Each holding shaft 60 is biased upward by a compression coil spring 61, as an elastic member as a sort of biasing device, that is provided between the rotatable body 50 and the each shaft 60. Thus, the cam follower 54 is forcedly contacted with a cam surface 58 of a stationary cam 56 fixed to the X-axis slide 32 that supports the rotatable body 50. The cam surface 58 has a circular shape whose center rides on the axis line of the rotatable body 50, and extends along a plane perpendicular to the axis line. The cam surface 58 includes a height-position-variable portion whose height position is continuously variable in a circumferential direction thereof. Since the respective cam followers 54 of the holding shafts 60 follow or roll on the cam surface 58 when the rotatable body 50 is rotated, the holding shaft 60 are moved up and down in directions parallel to the axis line of the rotatable body 50. The EC-hold-and-mount position corresponds to the lowest portion of the cam surface 58, and the image-take position corresponds to the highest portion of the cam surface 58.

At a position, on the X-axis slide 32, corresponding to the EC-hold-and-mount position, there is provided an elevating and lowering device 62 (FIG. 4) which elevates and lowers each of the holding shafts 60. The elevating and lowering device 62 may be one which is disclosed in Japanese Patent Document 11(1999)-220294 and its corresponding U.S. patent application Ser. No. 09/234,489, that is, includes a drive motor, such as a servomotor, as a drive source, and a movable member which is elevated and lowered by the drive source so as to engage the cam follower 54 of each holding shaft 60. The movable member is moved up and down between an upper position where a lower surface of a driving portion of the movable member is substantially continuous with the cam surface 58 and provides a portion of the stationary cam 56, and a lower position lower than the upper position. When each holding shaft 60 is moved to the EC-hold-and-mount position, owing to the rotation of the rotatable body 50, and the cam follower 54 of the each shaft 60 is engaged with the lower surface of the driving portion of the movable member, the each shaft 60 and the suction nozzle 64 supported thereby are lowered. When the movable member is elevated, the each shaft 60 is moved upward owing to the biasing force of the compression coil spring 61. Alternatively, the holding shafts 60 may be elevated and lowered by a plurality of elevating and lowering devices, respectively, each of which may be one which includes, as disclosed in Japanese Patent Document 11(1999)-214897 and its corresponding U.S. patent application Ser. No. 09/233,021, a pressurized-fluid-operated cylinder device. Though the X-axis slide 32 supports a rotating device which can rotate each holding shaft 60 about its own axis line to correct a rotation-position error of the EC 28 held by the suction nozzle 64, or change a current rotation position of the same 28, no description thereof is omitted.

Each of the suction nozzle 64 sucks and holds an EC 28 by applying negative pressure or vacuum to the EC 28. Each suction nozzle 64 is connected to a passage 66 formed in the corresponding holding shaft 60, and a corresponding switch valve 68 attached to the rotatable body 50. The switch valve 68 is connected to a negative-pressure supply source, not shown, via a passage (not shown) formed in the rotatable body 50. The switch valve 68 is switched, by a control device 160, described later, to a negative-pressure-supply position where the valve 68 changes the air pressure in the suction nozzle 64, from a value higher than an atmospheric pressure, to a negative pressure, thereby allowing a suction surface 70 of the suction nozzle 64 to suck an EC 28, and to an EC-release position where the valve 68 changes the air pressure of the suction nozzle 64, from the negative pressure to the value higher than the atmospheric pressure, thereby allowing the suction nozzle 64 to release the EC 28. Even when the rotatable body 50 is rotated, the passages formed in the rotatable body 50 are kept communicated with a passage which is formed in the X-axis slide 32 and is connected to the negative-pressure supply source.

Figure 3:
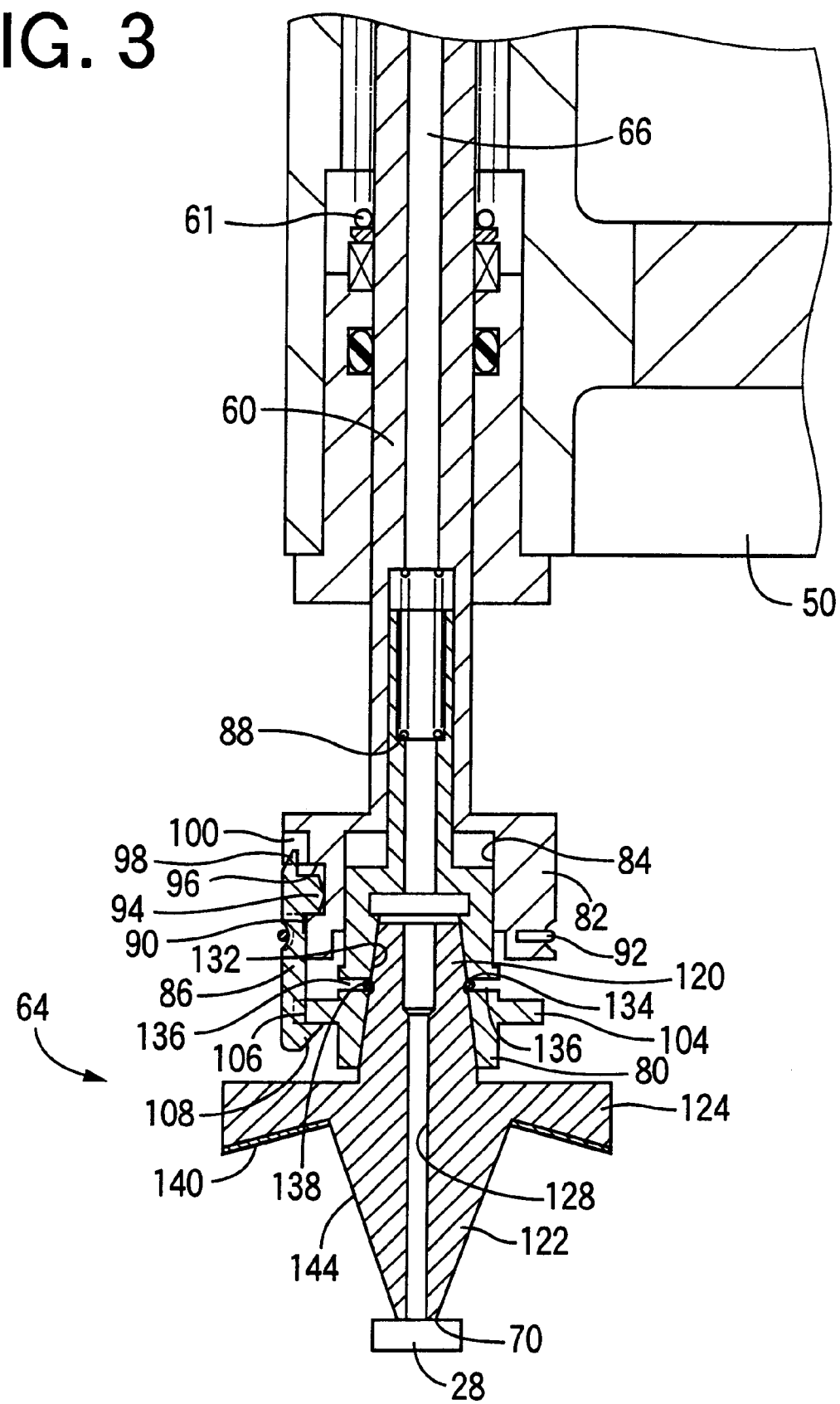
FIG. 3 is a cross-sectioned, front elevation view of the suction nozzle, an adaptor, and a holding shaft of the EC transferring and mounting apparatus.

As shown in FIG. 3, each of the suction nozzles 64 is attached to one holding shaft 60 via an adaptor 80. The adaptor 80 is fitted in a receiving hole 84 formed in a nozzle-holding portion 82 provided by the lower end portion of the holding shaft 64. The adaptor 80 is movable relative to the holding shaft 60 in an axial direction thereof. The adaptor 80 is held by a plurality of holding members 86 (only one holding member 86 is shown in FIG. 3) which are supported by the nozzle-holding portion 82 such that the holding members 86 are equiangularly spaced from each other about the axis line of the holding shaft 60. The adaptor 80 is biased in a direction in which the adaptor 80 projects downward out of the nozzle-holding portion 82, by a compression coil spring 88 as an elastic member as a sort of biasing device.

The nozzle-holding portion 82 has a plurality of recesses 90 which extend parallel to the axis line of the holding shaft 60 and which are equiangularly spaced from each other about the axis line. The holding members 86 are fitted in the recesses 90, respectively, such that the holding members 86 are pivotable in the recesses 90. The holding members 86 are held on the nozzle-holding portion 82, with the help of an annular spring member 92 which is wound around the nozzle-holding portion 82. The holding members 86 include respective projections 94 which project toward the center line of the nozzle-holding portion 82 and which are fitted in respective holes 96 formed in the holding portion 82 such that each of the holding members 86 is engaged with a bottom surface of the corresponding hole 96 and is pivotable about an axis line perpendicular to a lengthwise direction thereof and tangential to a portion of the holding portion 82 to which the each holding member 86 is attached.

In addition, each holding member 86 includes an operative portion 98 which is provided above the projection 94 and is fitted in a hole 100 formed in the nozzle-holding portion 82. Since the projection 94 and the operative portion 98 of each holding member 86 are fitted in the holes 90, 100 of the nozzle-holding portion 82, respectively, the each holding member 86 is prevented from being pivoted about an axis line which perpendicularly intersects the axis line of the holding shaft 60.

A lower portion of each of the holding members 86 is fitted in a corresponding one of a plurality of holes 106 formed in a large-diameter engaging portion 104 of the adaptor 80. Thus, the adaptor 80 is prevented from being rotated relative to the nozzle-holding portion 102. Each holding member 86 has an engaging projection 108 which projects from a lower end portion thereof toward the adaptor 80 and which is engageable with a lower surface of the large-diameter engaging portion 104. Thus, the adaptor 80 is prevented from coming out of the receiving hole 84 of the nozzle-holding portion 82. In the state in which the respective engaging projections 108 of the holding members 86 are disengaged from the engaging portion 104 of the adaptor 80, by pushing the operative portions 98 of the holding members 86 and thereby pivoting the holding members 86 against the biasing force of the spring member 92, the adaptor 80 can be removed off the nozzle-holding portion 82 of the holding shaft 60.

Each of the suction nozzles 64 includes a fitting portion 120 as a base portion, a nozzle portion 122, and a light radiating portion 124 which is provided between the nozzle portion 122 and the fitting portion 120 so as to extend radially outwardly. Those three portions 120, 122, 124 are integral with one another. The free or lower end surface of the nozzle portion 122 provides a suction surface 70 which is perpendicular to the center axis line of the suction nozzle 64 and which sucks and holds an EC 28. The light radiating portion 124 extends radially outwardly from a base-side end portion of the nozzle portion 122. An inner passage 128 formed in the suction nozzle 64 extends through the nozzle 64 along the center axis line thereof, and opens in the suction surface 70. The passage 128 provides a suction passage. The fitting portion 120 provides a tapered portion whose outer surface is tapered or inclined such that as the tapered surface approaches the light radiating portion 124, the diameter of the tapered surface increases. The fitting portion 120 is fitted in a tapered hole 132 as a receiving hole as a sort of receiving portion that is formed in the adaptor 80, and is held by the adaptor 80 via a spring member 134. The spring member 134 has a generally U-shaped configuration whose two arms are fitted in two recesses 136 formed in the adaptor 80, respectively. The distance between the two arms gradually decreases in a direction toward respective free ends of the two arms, so that the spring member 134 fastens the fitting portion 120 to the adaptor 80. In addition, the respective end portions of the two arms are bent in respective directions toward each other, so that the spring member 134 is prevented from coming off the adaptor 80.

In the state in which the tapered fitting portion 120 is fitted in the tapered hole 132, the spring member 134 is fitted in an annular groove 138 formed in an outer surface of the tapered portion 120. Thus, the spring member 134 engages the tapered portion 120, thereby holding the suction nozzle 64. In addition, the spring member 134 draws the tapered portion 120 of the suction nozzle 64, into the tapered hole 132 of the adaptor 100. Thus, the suction nozzle 64 is positioned relative to the adaptor 80. The suction nozzle 64 can be removed from the adaptor 80, by applying, to the nozzle 64, a force greater than the nozzle drawing force of the spring member 134, in a direction in which the nozzle 64 is moved away from the adaptor 80. Thus, each adaptor 80 provides a nozzle chuck. Each adaptor 80 is detachably attached to one holding shaft 60 as a chuck-holding member. Each holding shaft 60 holds one suction nozzle 64 via one adaptor 80.

The light radiating portion 124 has a generally disc-like shape, and a lower surface of the radiating portion 124 located on the side of the nozzle portion 122 is so tapered that a diameter of the lower surface linearly decreases as a distance of the lower surface as measured from the suction surface 70 in an axial direction of the suction nozzle 64 increases. The lower surface of the light radiating portion 124 is provided by a fluorescent surface 140 which is formed of a fluorescent material and which absorbs an ultraviolet light and radiates a visible light.

The nozzle portion 122 has a tapered shape whose diameter linearly increases in a direction from the suction surface 70 toward the base-side end portion of the nozzle portion 122. An outer circumferential surface of the nozzle portion 122 is subjected to mirror finishing so as to provide a reflection surface 144. The reflecting mirror surface 144 may be formed by, e.g., plating. However, in the present embodiment, the mirror surface 144 is formed by lapping. A plurality of sorts of suction nozzles 64 corresponding to a plurality of sorts of ECs 28 are employed, and each sort of suction nozzle 64 is selected to hold a corresponding sort of EC 28, in such a manner that the diameter of the suction surface 70 of the each sort of nozzle 64 is smaller than a projection of the corresponding sort of EC 28.

Figure 5:
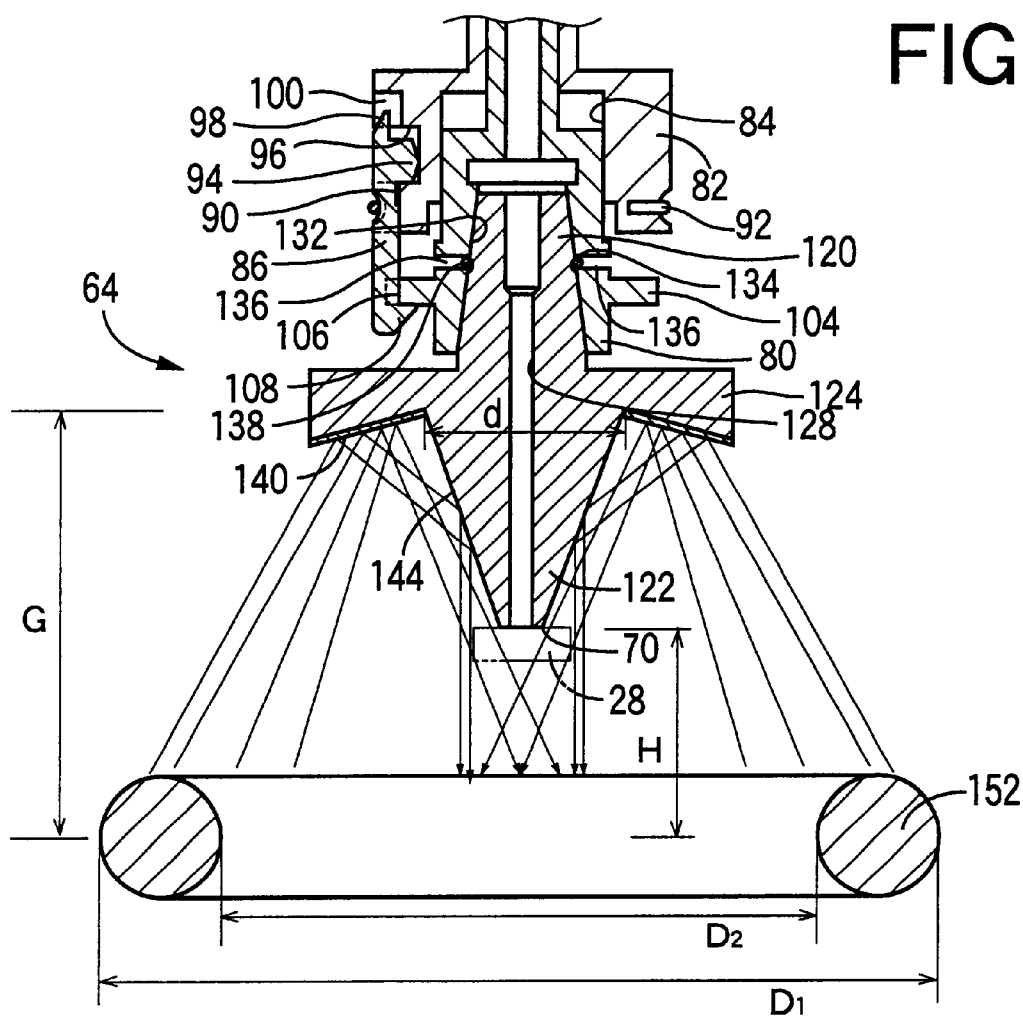
FIG. 5 is a cross-sectioned, front elevation view of the suction nozzle, an image taking device, and a light source.

As shown in FIG. 5, at a position, on the X-axis slide 32, corresponding to the above-described image-take position, there are provided a light emitter 152 and an image taking device 154. In the present embodiment, the light emitter 152 is provided by a ring lamp, and is disposed at a position where the light emitter 152 is concentric with each suction nozzle 64 being positioned at the image-take position, and which is located between the each suction nozzle 64 and the image taking device 154 in the axial direction of the nozzle 64. The light emitter 152 emits an ultraviolet light in a direction from the suction surface 70 toward the base-side end portion of the nozzle portion 122. In the present embodiment, the image taking device 154 is provided by a CCD (charge-coupled device) camera equipped with an optical system including a lens. The image taking device 154 is opposed to a lower (i.e., rear) surface of the EC 28 held by the suction nozzle 64 being positioned at the image-take position. The lower surface of the EC 28 will be contacted with the PWB 24, when the EC 28 is mounted on the PWB 24. The image taking device 154 takes an image of the lower surface of the EC 28, in a direction perpendicular to the lower surface. The CCD camera of the image taking device 154 includes a matrix of CCDs, i.e., a matrix of image-take elements that define an image-take surface on which an image of the EC 28 is formed. Each of the CCDs is sensitive to a visible light but is not sensitive to an ultraviolet light.

Figure 4:
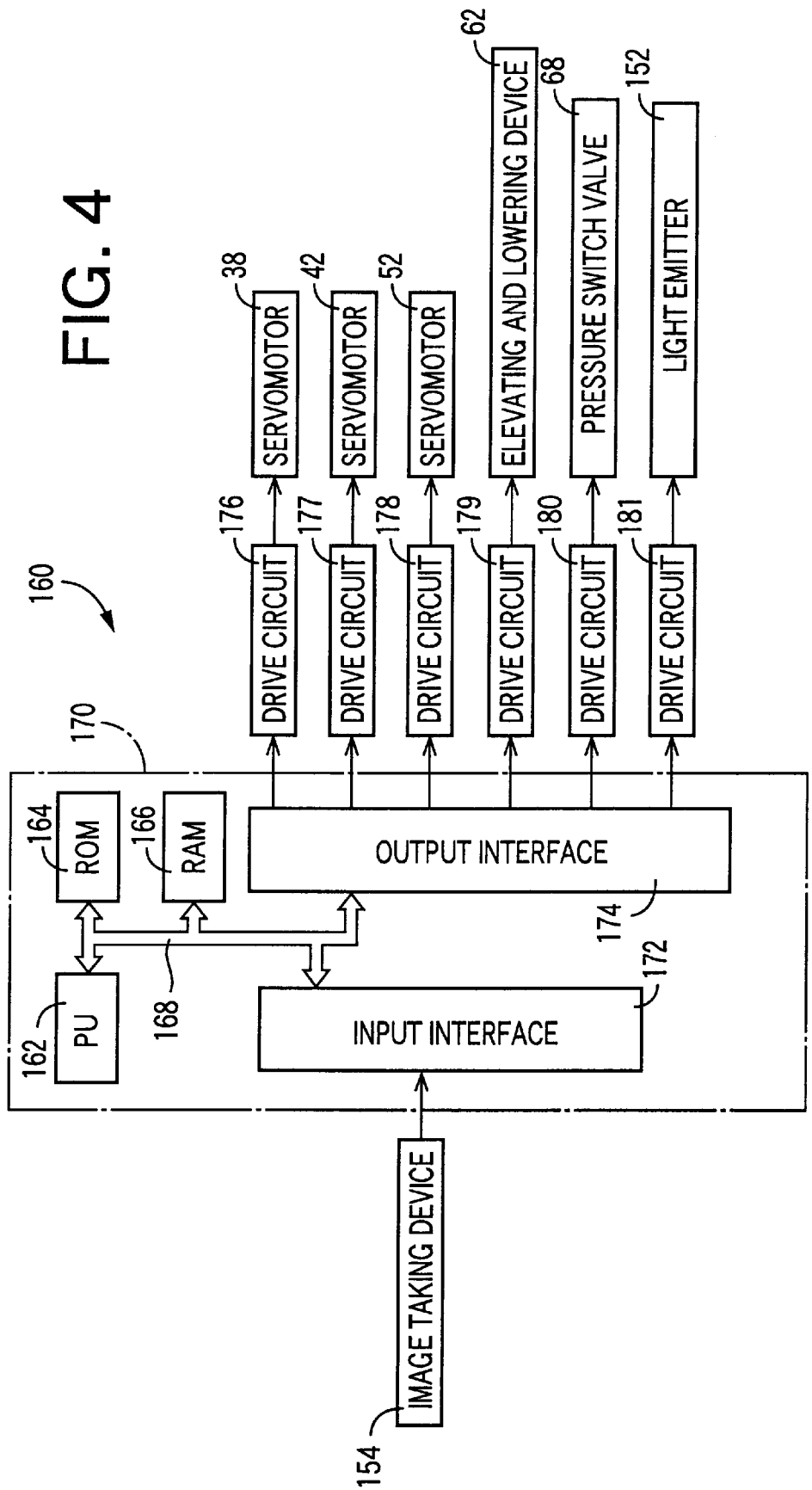
FIG. 4 is a block diagram of a relevant portion of a control device of the EC mounting system.

The PWB conveyor 12, the EC supplying devices 14, 15, the EC transferring and mounting apparatuses 16, 17, etc. are controlled by a control device 160 shown in FIG. 4. The control device 160 is essentially constituted by a computer 170 including a PU (processing unit) 162, a ROM (read only memory) 164, a RAM (random access memory) 166, and a bus 168 which connects those elements 162, 164, 166 to one another. An input interface 172 is connected to the bus 168, and the image taking device 154 is connected to the input interface 172. The bus 168 is connected to an output interface 174 which in turn is connected via respective drive circuits 176, 177, 178, 179, 180, 181 to the servomotors 38, 42, 52, the elevating and lowering device 62, the pressure switch valve 68, and the light emitter 152.

Hereinafter, there will be described the operation of the present EC mounting system constructed as described above. The two EC supplying apparatuses 16, 17 alternately mount ECs 28 on a PWB 24 positioned and supported by each one of the two main conveyors 18, 19. While ECs 28 are mounted on a PWB 28 positioned and supported by one main conveyor 18 or 19, a PWB 24 on which ECs 28 have been mounted is carried out from the other main conveyor 19 or 18 and a new PWB 24 is carried in onto the other main conveyor and is positioned and supported by the same. The new PWB 24 waits, on the other main conveyor, for mounting of ECs 28. The EC transferring and mounting apparatus 16 takes ECs 28 from the EC supplying device 14, and the EC transferring and mounting apparatus 17 takes ECs 28 from the EC supplying device 15. Hereinafter, there will be described a manner in which the EC transferring and mounting apparatus 16 as a representative of the two similar apparatuses 16, 17 is operated to take and mount ECs 28.

When the EC transferring and mounting apparatus 16 takes ECs 28, the rotatable body 50 is intermittently rotated to position each of the plurality of holding shafts 60 at the EC-hold-and-mount position. Concurrently, the X-Y robot 36 is moved to a position right above the EC-supply portion of one feeder 26 that is to supply an EC 28 to the each holding shaft 60. When the each holding shaft 60 reaches the EC-hold-and-mount position, the drive source of the elevating and lowering device 62 is started to lower the movable member thereof and thereby lower the holding shaft 60. After the suction nozzle 64 contacts the EC 28, applies a negative pressure to a front surface of the EC 28, and holds the EC 28, the elevating and lowering device 62 elevates the movable member, so that the holding shaft 60 is moved upward owing to the biasing action of the compression coil spring 61. Thus, the suction nozzle 64 takes the EC 28 from the feeder 26.

Figure 6:
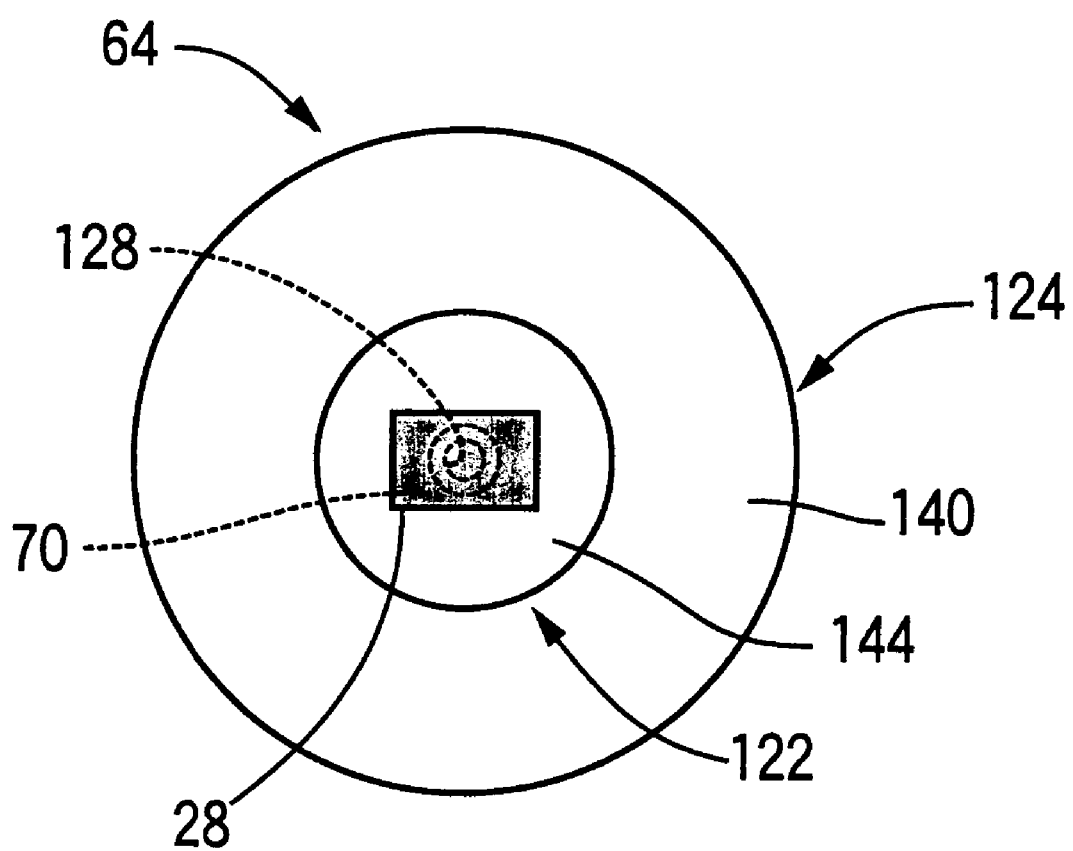
FIG. 6 is a view showing an image of an EC sucked and held by the suction nozzle, taken in a direction perpendicular to a rear surface of the EC.

After the suction nozzle 64 takes the EC 28, the suction nozzle 64 is moved to the image-take position right above the image taking device 154 and, preferably in a state in which the suction nozzle 64 is kept stopped, an image of the EC 28 held by the suction nozzle 64 is taken by the image taking device 154. In the present embodiment, a silhouette image of the EC 28 held by the suction nozzle 64 is taken. As shown in FIG. 5, the light emitter 152 is turned ON, to emit an ultraviolet light from the position below the EC 28 held by the suction surface 70, toward the fluorescent surface 140, which absorbs the ultraviolet light and radiates a visible light to irradiate the front surface of the EC 28. A portion of the visible light radiated by the fluorescent surface 140 is incident to the nozzle portion 122 of the suction nozzle 64. Since the outer circumferential surface of the nozzle portion 122 functions as the reflection surface 144 as described above, the visible light incident to the reflection surface 144 of the nozzle portion 122 is reflected downward to light the front surface of the EC 28. Thus, a silhouette image of the EC 28 is formed on the image-take surface of the CCD camera of the image taking device 154. FIG. 6 shows an image of the EC 28 taken in a direction perpendicular to the rear surface thereof. Though an outer diameter of the base-side end portion of the nozzle portion 122 is greater than the silhouette image of the EC 28, not only the fluorescent surface 140 but also the base-side end portion are taken as a light background image around the silhouette image of the EC 28, because the outer circumferential surface of the end portion functions as the reflection surface 144. Respective dimensions and respective positions of the nozzle portion 122, the fluorescent surface 140, and the light emitter 152 are so determined that a difference between the greatest and smallest brightness values of the light background image around the silhouette image of the EC 28 is not greater than 15% of the greatest brightness value. The greatest and smallest brightness values are selected from respective brightness values of respective picture elements or pixels taken by the respective CCDs of the CCD camera of the image taking device 154. More specifically described, a tapering angle of the reflection surface 144 of the nozzle portion, a diameter, d, of the base-side end of the nozzle portion 12, a tapering angle of the fluorescent surface 140, an outer diameter, D1, and an inner diameter, D2, of the light emitter 152 as the annular light source, a distance, G, of the fluorescent surface 140 from the light emitter 152, a distance, H, of the suction surface 70 from the light emitter 152, etc. are determined at respective appropriate values which cooperate with one another to satisfy the above-indicated condition. If the suction surface 70 of the suction nozzle 64 is not holding the EC 28, only the suction surface 70 is recognized as a silhouette image. Since, however, the suction surface 70 is smaller than the projection of the EC 28, the image of the suction surface 70 is hindered by the image of the EC 28. Therefore, only the EC 28 is taken as a silhouette image. Since a boundary line between the nozzle portion 122 and the light radiating portion 124 cannot be recognized because both are very light, FIG. 6 shows the boundary line for easier understanding purposes only.

The image taking device 154 supplies image data (e.g., gradation data such as 256-gradation data, or binary data) represents the silhouette image of the EC 28, to the control device 160, so that the control device 160 processes the image data and determine positions of the EC 28 held by the suction nozzle 64. More specifically described, the control device 160 compares the actual image data representing the image taken by the image taking device 154, with reference or correct image data, stored in the RAM 166, that represent a reference or correct image of an EC 28 held at correct positions by the suction nozzle 64, and the control device 160 determines respective errors, $\Delta X$ and $\Delta Y$, of respective actual positions of a point, prescribed on the EC 28, in the X-axis direction and the Y-axis direction, and an error, $\Delta\theta$, of an actual rotation position of the prescribed point of the EC 28 about an axis line about which the suction nozzle 64 is rotated. Then, the suction nozzle 64 holding the EC 28 is moved to a position right above an EC-mount place on the PWB 24 supported on the PWB conveyor 12, while the positional errors (i.e., the position errors $\Delta X$ and $\Delta Y$ and the rotation-position error $\Delta\theta$) of the EC 28 are corrected. Finally, the EC 28 is mounted on the PWB 24. Respective errors, $\Delta X$ and $\Delta Y$, of respective actual positions of the PWB 24 in the X-axis direction and the Y-axis direction have already been determined based on respective images, taken by an image taking device, not shown, of a plurality of (e.g., two) fiducial marks provided on the PWB 24, and respective position errors of respective EC-mount places prescribed on the PWB 24 in the X-axis and Y-axis directions have already been determined based on the thus determined position errors $\Delta X$ and $\Delta Y$ of the PWB 24 and a positional relationship between the fiducial marks and the EC-mount places, and stored in the RAM 166. The position error of each of the EC-mount places is corrected, while the suction nozzle 64 is moved from the image taking device 154 to a position right above the each EC-mount place. Thus, each EC 28 is mounted at a corresponding appropriate EC-mount place on the PWB 24.

It emerges from the foregoing description of the present embodiment that the fluorescent surface 140 of the light radiating portion 124 provides a light radiating surface, and the light emitter 152 provides an annular light source. In addition, a portion of the control device 160 that processes the image of the EC 28 taken by the image taking device 154 and thereby determines the position errors of the EC 28 held by each suction nozzle 64, provides an image processing device, which cooperates with each suction nozzle 64, the light emitter 152 and the image taking device 154 to provide an apparatus for detecting a position of an EC.

In the present embodiment, since the diameter of the nozzle portion 122 of each suction nozzle 64 increases in a direction toward its base-side end, each suction nozzle 64 can enjoy an increased flexural strength and an improved durability. This leads to improving the operation efficiency and the production efficiency, and reducing the production cost. In addition, the increased flexural strength contributes to reducing the vibration of the nozzle portion, and thereby improving the accuracy with which each EC 28 is mounted on a PWB 24. Though the outer diameter of the base-side end of the nozzle portion 122 is greater than the diameter of the suction surface 70, the difference of the greatest and smallest brightness values of the background image formed around the recognized image of the EC 28 can be controlled to be not greater than a prescribed value, because the outer circumferential surface of the nozzle portion 122 is provided by the reflection surface 144. Thus, a uniform and sufficiently light background is formed around the EC 28, and accordingly a clear silhouette image of the EC 28 can be obtained. Since the image taking device 154 is not sensitive to an ultraviolet light, a silhouette image of the EC 28 is not adversely influenced by an ultraviolet light which is emitted by the light emitter 152 and then reflected by peripheral devices or the EC 28 and then may possibly be incident to the image taking device 154. Thus, a clear and crisp silhouette image of the EC 28 can be obtained.

However, the light emitter 152 employed in the illustrated embodiment may be replaced with a different light emitter which emits a visible light. In the latter case, the fluorescent surface 140 as the light radiating surface of the light radiating portion 124 integral with the nozzle portion 122 may be replaced with a reflection surface which is formed by mirror finishing. The reflection or mirror surface may be provided by a layer which is formed by plating, or may be formed by lapping. In order to prevent the silhouette image of the EC 28 held by each suction nozzle 64 from being adversely influenced by the visible light reflected by the lower (i.e., rear) surface of the EC 28, it is desirable to provide a shield member at a position between the light emitter 152 and the EC 28 held by the suction nozzle 64.

Otherwise, the light emitter 152 may be replaced with a different light emitter which emits an infrared light.

Figure 7:
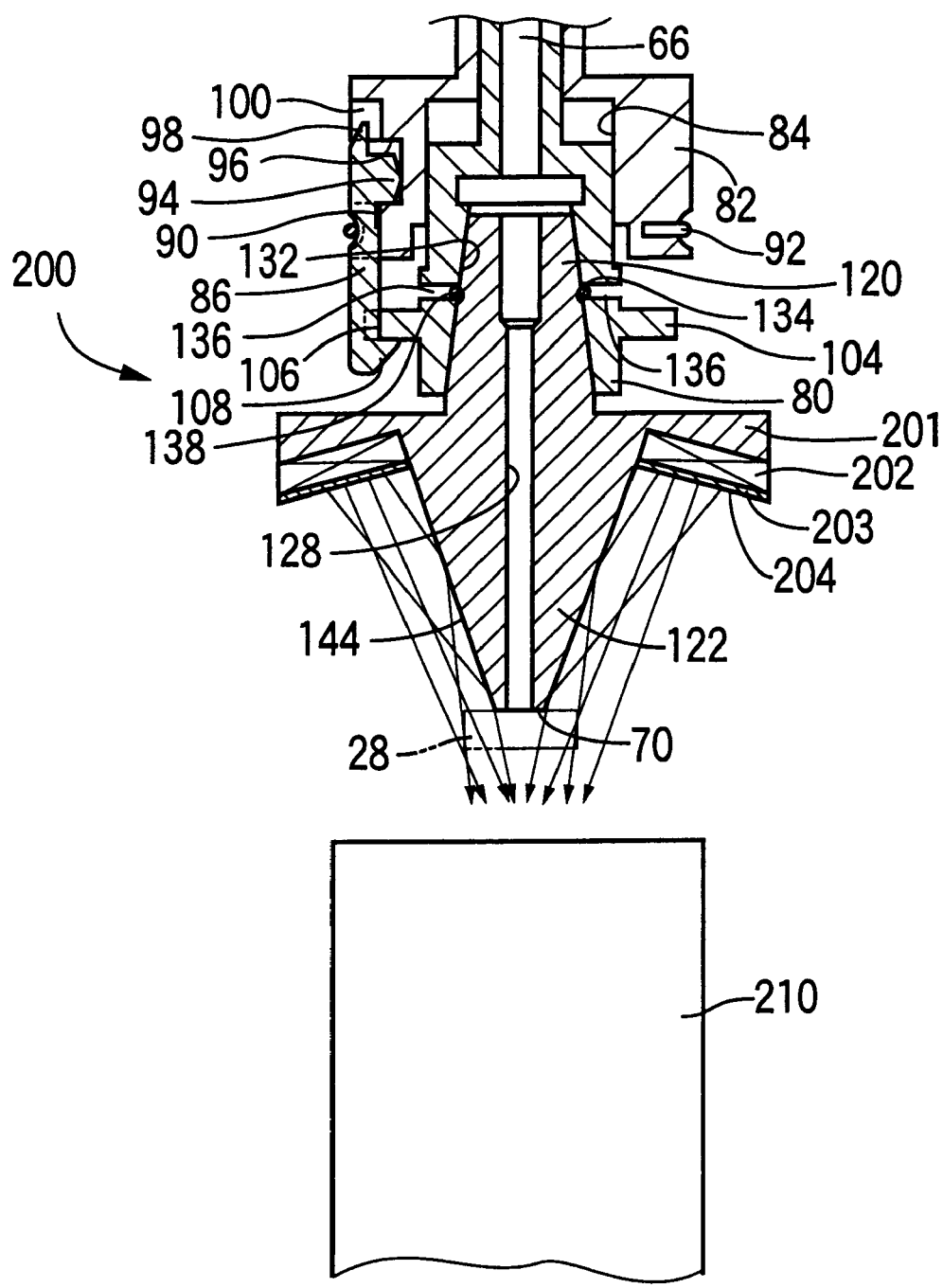
FIG. 7 is a cross-sectioned, front elevation view of another suction nozzle and another EC-position detecting apparatus as another embodiment of the present invention.

A light emitter may be provided on one side of an EC 28 held by a suction nozzle 200 that is opposite to the other side on which an image taking device is provided, as carried out in another embodiment shown in FIG. 7. The suction nozzle 200 has a light radiating portion including a support portion 201 having an inner tapered surface to which a light emitting portion 202 is fixed. The light emitting portion 202 includes a printed board and a number of light emitting diodes (LEDs) which are arranged at respective lattice points on the printed board. The light emitting portion 202 is covered by a translucent diffusion plate 203 which diffuses respective lights emitted by the LEDs. Thus, an inner (i.e., lower) surface of the diffusion plate 203 provides a light radiating surface 204 which emits a substantially uniform light. Since the printed board and the LEDs are well known in the art, the illustrated and detailed description thereof are omitted. The light emitting portion 202 is connected to a drive circuit via a lead wire, not shown. If an electric current is supplied from the drive circuit to the light emitting portion 202, the light radiating surface 204 of the portion 202 radiates a light toward the nozzle portion 122. Each of the LEDs, selected and employed, emits a visible light. An image taking device 210 includes a CCD camera which is sensitive to a visible light. However, the light emitting portion 202 may be replaced with a different light emitting portion which emits an ultraviolet light or an infrared light, and the image taking device 210 may be replaced with a different image taking device which is sensitive to an ultraviolet light or an infrared light. Alternatively, it is possible to provide an ultraviolet-light-transmission filter or an infrared-light-transmission filter at a position between the image taking device 210 and the light emitting portion 202, so that the filter removes the other components than the ultraviolet-light or infrared-light component. The last feature may be employed in the other embodiments of the present invention. In the present embodiment, the support portion 201, the light emitting portion 202, and the diffusion plate 203 cooperate with one another to provide the light emitting portion which incorporates the light source 202. An image taken by the image taking device 210 can be processed in the same manner as that employed in the preceding embodiment, and accordingly the explanation of the manner is omitted. In the present embodiment, too, an excellent silhouette image of the EC 28 can be obtained.

Figure 8:
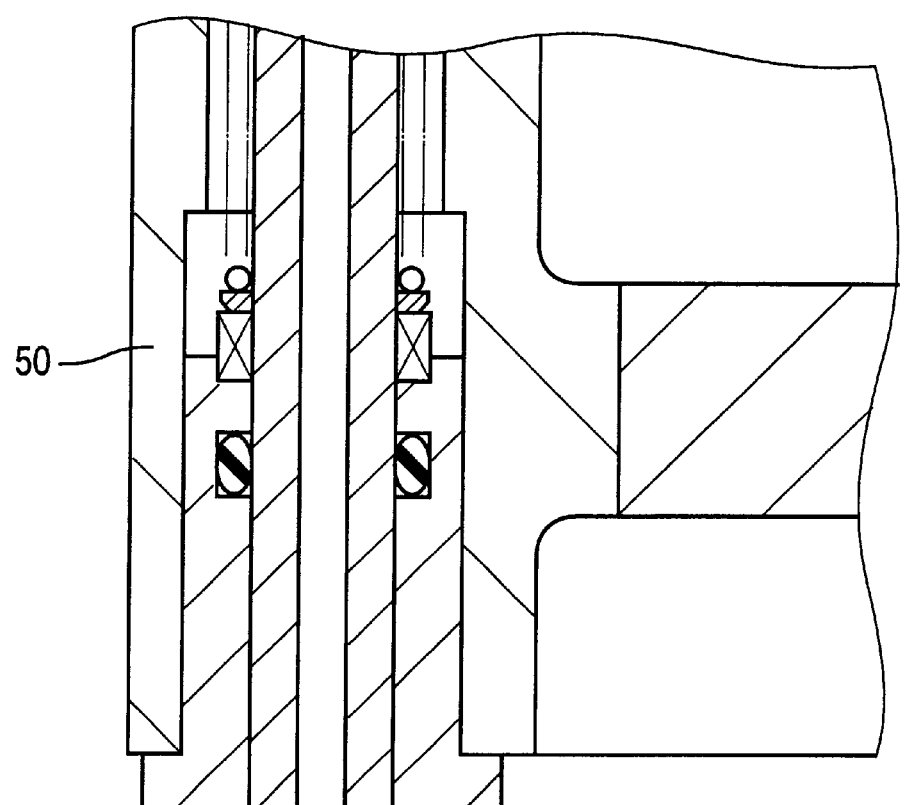
FIG. 8 is a cross-sectioned, front elevation view of yet another suction nozzle and yet another EC-position detecting apparatus as yet another embodiment of the present invention.

Only a free end portion of a nozzle portion of a suction nozzle may be tapered, as carried out in another embodiment shown in FIGS. 8 and 9. The same reference numerals as used in the preceding embodiments are used to designate the elements having the corresponding functions, and the description thereof is omitted. The following description relates to only the differences between the preceding embodiments and the present embodiment. The present embodiment relates to an EC transferring and mounting apparatus which includes a rotatable body 50 and a holding shaft 302 and a suction nozzle 304 which is held by the rotatable body 50 such that the shaft 302 and the nozzle 304 are movable in directions parallel to an axis line about which the rotatable body 50 is rotatable, and are rotatable about their own axis line. The holding shaft 302 projects downward from the rotatable body 50, and has a nozzle-receiving hole 308 that is coaxial with the shaft 302. The suction nozzle 304 is fitted in the nozzle-receiving hole 308, such that the nozzle 304 is movable relative to the hole 308 in an axial direction of the holding shaft 302. The suction nozzle 304 includes a nozzle-portion holding portion 310 and a nozzle portion 312 held by the nozzle-portion holding portion 310, and is biased, by a compression coil spring 316 as an elastic member as a sort of biasing device, in a direction in which the nozzle 304 advances out of the nozzle-receiving hole 308. Thus, the nozzle-portion holding portion 310 provides a base portion of the suction nozzle 304. A pin 320 as an engaging pin that is fitted in the nozzle-portion holding portion 310 prevents the suction nozzle 304 from coming off the nozzle-receiving hole 308 and rotating relative to the holding shaft 302, because the pin 320 engages a recess 322 as an engaging portion that is formed through the thickness of the annular wall defining the nozzle-receiving hole 308. The nozzle-portion holding portion 310 includes, at a lower end thereof, a light radiating portion 326 which extends radially outwardly from a base-side end of the nozzle portion 312. The light radiating portion 326 has a generally disc-like shape, and a lower surface of the light radiating portion 326, located on the side of the nozzle portion 312, is a planar surface perpendicular to the central axis line of the suction nozzle 304, and is covered with a fluorescent layer to provide a fluorescent surface 328 which absorbs an ultraviolet light and radiates a visible light toward the EC 28.

The suction nozzle 304 applies a negative pressure or suction to an EC 28 and thereby holds the EC 28. The nozzle 304 has an inner passage 331 which is connected, at one end thereof, to a negative-pressure supply device via an inner passage 66 of the holding shaft 302, and opens, at the other end thereof, in a suction surface 332 as an end surface of the nozzle portion 332. The inner passage 331 provides a suction passage of the nozzle portion 312. The nozzle portion 312 includes a free end portion 334 which has the suction surface 332 as the end surface and has such a tapered shape whose diameter linearly increases in a direction from the end surface toward a shank portion 336 as a fitting portion that is fitted in the nozzle-portion holding portion 310. Since the shank portion 336 has a cylindrical shape having a constant diameter, the nozzle portion 312 can be easily fitted in the nozzle-portion holding portion 310. An outer circumferential surface of the nozzle portion 312 is provided, like the preceding embodiments, by a reflection surface 338 which is formed by mirror finishing. As shown in FIG. 9, at a position where an image of the EC 28 held by the suction nozzle 304 is taken, there is provided a light emitter 152 which emits an ultraviolet light, and an image taking device 154 which is not sensitive to an ultraviolet light and is sensitive to a visible light, like the embodiment shown in FIGS. 1 to 6.

In the present embodiment, too, since the nozzle portion 312 of the suction nozzle 304 includes the shank portion 336 thicker than the free end portion 334, the suction nozzle 304 can enjoy increased flexural strength and rigidity. In addition, since the diameter of the free end portion 334 is smaller than the size of the EC 28, the silhouette image of the EC 28 can be easily processed. Moreover, since the outer circumferential surface of the nozzle portion 312 is provided by the reflection surface 338, the EC 28 has a sufficiently light background, which leads to obtaining an excellent silhouette image of the EC 28.

The embodiment shown in FIGS. 8 and 9 may be modified in such a manner that the light radiating portion 326 incorporates a light source like the embodiment shown in FIG. 7.

The lower surface of the light radiating portion 326 may be so modified as to have a tapered shape whose diameter linearly decreases as the distance of the lower surface from the suction surface 332 of the nozzle portion 312 in the axial direction thereof increases, like the embodiment shown in FIGS. 1 to 6. In addition, only the outer circumferential surface of the tapered, free end portion 334 of the nozzle portion 312 may be provided by a reflection surface which is formed by mirror finishing.

In each of the illustrated embodiments, only a radially outer portion of the light radiating surface 140, 204, 328 of the light radiating portion 124, 201–203, 326 may have a tapered shape whose diameter linearly decreases as the distance of the radially outer portion from the suction surface 70, 332 of the nozzle portion 122, 312 in the axial direction thereof increases.

In each of the illustrated embodiments, the shape of the outer circumferential surface of the nozzle portion 122, 312 and the shape of the light radiating surface 140, 204, 328 of the light radiating portion 124, 201–203, 326 may be changed, as needed, in consideration of the requirements that the diameter of the suction surface 70, 332 of the suction nozzle 64, 200, 304 should be smaller than the contour of the small EC 28 and the suction nozzle 64, 200, 304 should have a necessary flexural strength. As explained in connection with each of the preceding embodiments, each of the above-indicated shapes may differ from the tapered shape whose diameter linearly increases and, for example, may be such a shape whose diameter increases nonlinearly, e.g., convexly or concavely.

In each of the illustrated embodiments, the suction nozzle 64, 200, 304 radiates light toward the front surface of the EC 28, and the silhouette image of the EC 28 is taken. However, it is possible to radiate light toward the rear surface of the EC 28 and take an image of the EC 28 based on the light reflected from the rear surface thereof. In this case, a reflected-light image of the EC 28 is taken. To this end, it is desirable that the outer circumferential surface 144, 338 of at least the tapered portion 122, 334 of the nozzle portion 122, 312 have a dark color such as a black color, so that the dark surface may absorb the remainder of the light emitted from a light emitter in an upward direction toward the EC 28. In this case, too, the suction nozzle can enjoy improved flexural strength and rigidity, and reduced vibration and improved EC-mounting accuracy.

The X-Y robot 36, 37, the rotating device including the servomotor 52, and the elevating and lowering device 62 cooperate with each other to provide a moving device which moves each suction nozzle 64. However, the moving device may be so modified as to include a movable member which supports a holding shaft 60 holding a suction nozzle 64 such that the holding shaft 60 can be elevated and lowered, an elevating and lowering device which elevates and lowers the holding shaft 60, and an X-Y robot which moves the movable member to an arbitrary position on a horizontal plane. Alternatively, at least one of the EC supplying device 14, 15 and the PWB positioning and supporting device of the main conveyor 18, 19 may be so modified as to be movable relative to each suction nozzle 64. Moreover, the present invention is applicable to an EC mounting system including a single EC supplying device, a single EC mounting device, and a single PWB conveyor.

While the present invention has been described in its preferred embodiments, it is to be understood that the present invention is not limited to the details of those embodiments but may be embodied with other changes and improvements, such as those described in SUMMARY OF THE INVENTION, that may occur to a person skilled in the art without departing from the spirit and scope of the invention defined in the appended claims.

What is claimed is:

1. A suction nozzle for applying a suction to an object and thereby holding the object, the suction nozzle comprising:
    a nozzle portion having an end surface;
    a suction passage formed in the nozzle portion and opening in the end surface thereof;
    the end surface providing a suction surface that applies the suction to the object and thereby holds the object;
    at least a free end portion of the nozzle portion having a shape whose diameter gradually increases in a direction from the end surface thereof toward a base end thereof opposite to the end surface;
    a light radiating portion extending radially outwardly from a base end portion of the nozzle portion, and having a light radiating surface which radiates a light toward the object held by the nozzle portion; and
    an outer circumferential surface of at least the free end portion of the nozzle portion that has the shape whose diameter gradually increases in said direction comprising a mirror surface which reflects the light radiated by the light radiating surface,
    wherein an entirety of the light radiating surface is so inclined that a distance of the light radiating surface from the end surface of the nozzle portion in a direction parallel to an axis line thereof gradually increases in a radially inward direction.

2. A suction nozzle for applying a suction to an object and thereby holding the object, the suction nozzle comprising:
    a nozzle portion having an end surface;
    a suction passage formed in the nozzle portion and opening in the end surface thereof;
    the end surface providing a suction surface that applies the suction to the object and thereby holds the object;
    at least a free end portion of the nozzle portion having a shape whose diameter gradually increases in a direction from the end surface thereof toward a base end thereof opposite to the end surface;

a light radiating portion extending radially outwardly from a base end portion of the nozzle portion, and having a light radiating surface which radiates a light toward the object held by the nozzle portion; and an outer circumferential surface of at least the free end portion of the nozzle portion that has the shape whose diameter gradually increases in said direction comprising a mirror surface which reflects the light radiated by the light radiating surface, wherein the light radiating surface has a tapered shape whose diameter linearly decreases as a distance of the light radiating surface from the end surface of the nozzle portion in a direction parallel to an axis line thereof increases.

3. A suction nozzle for applying a suction to an object and thereby holding the object, the suction nozzle comprising:

a nozzle portion having an end surface;

a suction passage formed in the nozzle portion and opening in the end surface thereof;

the end surface providing a suction surface that applies the suction to the object and thereby holds the object;

at least a free end portion of the nozzle portion having a shape whose diameter gradually increases in a direction from the end surface thereof toward a base end thereof opposite to the end surface;

a light radiating portion extending radially outwardly from a base end portion of the nozzle portion, and having a light radiating surface which radiates a light toward the object held by the suction surface; and at least a radially outer portion of the light radiating surface is so inclined that a distance of the radially outer portion from the end surface of the nozzle portion in a direction parallel to an axis line thereof gradually increases in a radially inward direction.

4. The suction nozzle according to claim 3, wherein the nozzle portion has a shape whose diameter gradually increases from the end surface to the base end.

5. The suction nozzle according to claim 3, wherein the nozzle portion has a tapered shape whose diameter linearly increases in the direction from end surface to the base end.

6. The suction nozzle according to claim 3, wherein the light radiating surface comprises a fluorescent surface which absorbs an ultraviolet light emitted by a light emitter in the direction from the end surface of the nozzle portion toward the base end thereof, and radiates a visible light.

7. The suction nozzle according to claim 3, wherein the light radiating surface comprises a reflection surface which reflects a light emitted by a light emitter in the direction from the end surface of the nozzle portion toward the base end thereof.

8. The suction nozzle according to claim 3, wherein the light radiating portion comprises a light emitting portion which incorporates a light source, and the light radiating surface radiates a light emitted by the light source.

9. A suction nozzle for applying a suction to an object and thereby holding the object, the suction nozzle comprising:

a nozzle portion having an end surface;

a suction passage formed in the nozzle portion and opening in the end surface thereof;

the end surface providing a suction surface that applies the suction to the object and thereby holds the object;

at least a free end portion of the nozzle portion having a shape whose diameter gradually increases in a direction from the end surface thereof toward a base end thereof opposite to the end surface;

a light radiating portion extending radially outwardly from a base end portion of the nozzle portion, and having a light radiating surface which radiates a light toward the object held by the nozzle portion;

at least a radially outer portion of the light radiating surface is so inclined that a distance of the radially outer portion from the end surface of the nozzle portion in a direction parallel to an axis line thereof gradually increases in a radially inward direction; and an outer circumferential surface of at least the free end portion of the nozzle portion that has the shape whose diameter gradually increases in said direction comprising a mirror surface which reflects the light radiated by the light radiating surface.

10. An apparatus for detecting a position of an object, comprising:

a suction nozzle which applies a suction to the object and thereby holds the object, the suction nozzle comprising
a nozzle portion having an end surface,
a suction passage formed in the nozzle portion and opening in the end surface thereof,
the end surface providing a suction surface that applies the suction to the object and thereby holds the object,
at least a free end portion of the nozzle portion having a shape whose diameter gradually increases in a direction from the end surface thereof toward a base end thereof opposite to the end surface,
a light radiating portion extending radially outwardly from a base end portion of the nozzle portion, and having a light radiating surface which radiates a light toward the object held by the suction surface, and
an outer circumferential surface of at least the free end portion of the nozzle portion that has the shape whose diameter gradually increases in said direction comprising a mirror surface which reflects the light radiated by the light radiating surface;

an annular light source which is provided at a position where the annular light source is caused, at at least one timing, to be concentric with the suction nozzle, and which radiates a light along the nozzle portion;

an image taking device which takes an image of the object held by the nozzle portion, and a background of the object, at said at least one timing; and an image processing device which processes image data representing the image taken by the image taking device and thereby determines the position of the object held by the nozzle portion, wherein at least a radially outer portion of the light radiating surface is so inclined that a distance of the radially outer portion from the end surface of the nozzle portion in a direction parallel to an axis line thereof gradually increases in a radially inward direction.

11. The apparatus according to claim 10, wherein respective dimensions and positions of the nozzle portion, the light radiating surface, and the light source are so determined that a difference between a greatest brightness, and a smallest brightness, of the background of the object in the image taken by the image taking device is not greater than 25% of the greatest brightness.

12. The apparatus according to claim 10, wherein the suction nozzle holds an electric component as the object.

* * * * *